United States Patent
Yamazoe et al.

(10) Patent No.: US 7,221,610 B2
(45) Date of Patent: May 22, 2007

(54) CHARGE PUMP CIRCUIT FOR GENERATING HIGH VOLTAGES REQUIRED IN READ/WRITE/ERASE/STANDBY MODES IN NON-VOLATILE MEMORY DEVICE

(75) Inventors: Takanori Yamazoe, Hadano (JP); Yuichiro Akimoto, Kawasaki (JP); Hisanobu Ishida, Kokubunji (JP); Eiji Yamasaki, Kodaira (JP); Nobuhiro Oodaira, Akishima (JP)

(73) Assignee: Renesas Technology Corp., Tokyo (JP)

( * ) Notice: Subject to any disclaimer, the term of this patent is extended or adjusted under 35 U.S.C. 154(b) by 87 days.

(21) Appl. No.: 11/050,753

(22) Filed: Feb. 7, 2005

(65) Prior Publication Data

US 2005/0207236 A1    Sep. 22, 2005

(30) Foreign Application Priority Data

Mar. 18, 2004    (JP) .............................. 2004-077757

(51) Int. Cl.
*G11C 5/14* (2006.01)
(52) U.S. Cl. ...................... 365/226; 365/229; 327/536
(58) Field of Classification Search ............ 365/226 O, 365/229 X, 226, 229; 327/536 X, 536
See application file for complete search history.

(56) References Cited

U.S. PATENT DOCUMENTS

| | | | | |
|---|---|---|---|---|
| 5,732,039 A | * | 3/1998 | Javanifard et al. ......... | 365/226 |
| 5,767,735 A | * | 6/1998 | Javanifard et al. ......... | 327/536 |
| 6,121,821 A | * | 9/2000 | Miki .......................... | 327/536 |
| 6,151,229 A | * | 11/2000 | Taub et al. ................... | 363/60 |
| 6,891,764 B2 | * | 5/2005 | Li .......................... | 365/189.09 |
| 6,927,441 B2 | * | 8/2005 | Pappalardo et al. ........ | 257/299 |
| 2004/0095806 A1 | | 5/2004 | Osawa et al. | |

FOREIGN PATENT DOCUMENTS

| | | |
|---|---|---|
| JP | 60-095794 | 5/1985 |
| JP | 61-077197 | 4/1986 |
| WO | PCT/WO 97/12369 | 4/1997 |
| WO | WO 2004/047274 A1 | 6/2004 |

OTHER PUBLICATIONS

T. Tanzawa and T. Tanaka, "A dynamic analysis of the Dickson charge pump circuit;" IEEE J. Solid-State Circuits, vol. 32, No. 8, pp. 1231-1240, Aug. 1997.

* cited by examiner

*Primary Examiner*—VanThu Nguyen
(74) *Attorney, Agent, or Firm*—Antonelli, Terry, Stout & Kraus, LLP.

(57) ABSTRACT

Different stepped-up voltages and different output currents are generated in one charge pump circuit without increasing the chip area of the charge pump circuit and also electric power consumption in the charge pump circuit to be reduced to a very low power consumption level in standby mode and other modes. A semiconductor integrated circuit device comprises one charge pump circuit with an N number of basic pump cell stages connected to step up voltages in the erase and write modes of a non-volatile memory or the like, generates stepped-up voltages lower than in the erase and write modes and different from one another in output current supply capability, by using series- or parallel-connected pump cells not in excess of the N number of pump cell stages mentioned above, and changes a voltage step-up clock to a stepped-up voltage detection signal.

13 Claims, 9 Drawing Sheets

FIG.2
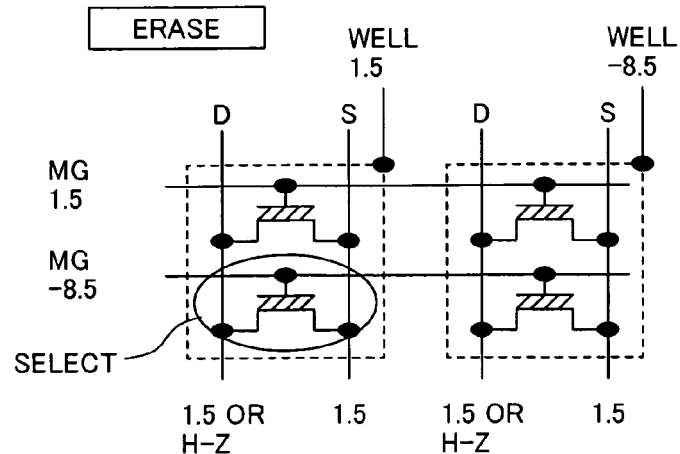
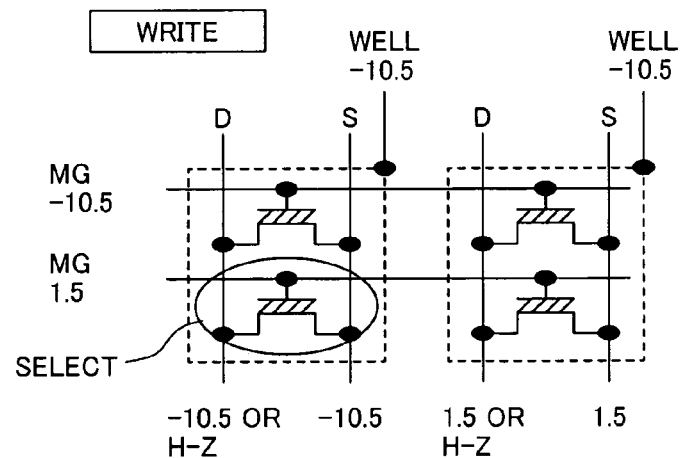
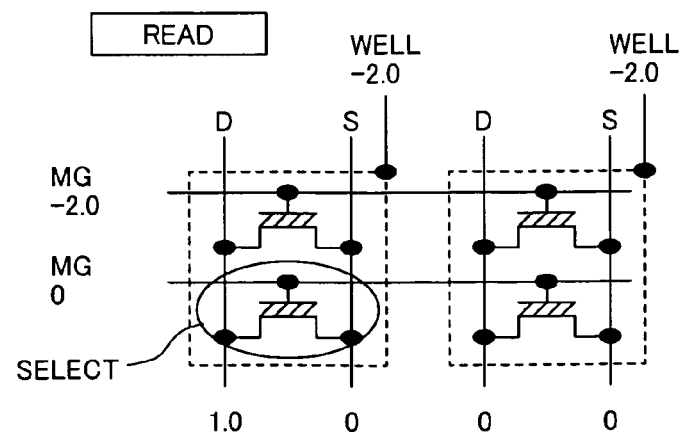

@Vdd=1.375~1.625V, Ta=-40~95°C

| | Vpp | CURRENT ABILITY IL | CURRENT CONSUMPTION | NOTE |
|---|---|---|---|---|
| ERASE /WRITE | ERASE: -8.5V±0.2 *1<br>WRITE: -10.7V±0.2 | 10 μA | TBD | *1<br>ERASE=Vdd-Vpp=10V<br>WRITE=Vdd-Vpp=12.2V |
| READ | -2.0V±0.15 | 120 μA typ. *2 | TBD | *2<br>MG TOTAL<br>CAPACITANCE 2pF<br>READ 30MHz<br>IL=2p*2.0*30M |
| STAND BY | -1.5V typ. | 1 μA max. | ≦10 μA avg. | |

US 7,221,610 B2

CHARGE PUMP CIRCUIT FOR GENERATING HIGH VOLTAGES REQUIRED IN READ/WRITE/ERASE/STANDBY MODES IN NON-VOLATILE MEMORY DEVICE

CLAIM OF PRIORITY

The present application claims priority from Japanese application JP 2004-077757, filed on Mar. 18, 2004, the content of which is hereby incorporated by reference into this application.

BACKGROUND OF THE INVENTION

1. Field of the Invention

The present invention relates to a charge pump circuit that generates the high voltages required for data erase and read/write operations on a non-volatile memory such as a flash memory, and to a semiconductor integrated circuit using the same.

2. Description of the Related Art

To use a tunneling effect or hot electrons and/or hot holes during erase and/or write operations, a high voltage needs to be generated in non-volatile memories such as a flash memory or an EEPROM (Electrically Erasable Programmable Read-Only Memory).

Electrically rewritable EEPROMs include a metal-oxide nitride-oxide semiconductor (MONOS) type of EEPROM, and the operating biases in the erase, write, and read modes of the MONOS-type EEPROM that uses MONOS-structured memory cells and enhanced N-type switch metal-oxide semiconductors (MOS's) to construct a one-bit data pattern are shown in FIG. 1 by way of example.

The operating biases in FIG. 1 are for a power supply voltage of Vdd=1.5 V. In this case, the memory cells in erase mode take a threshold voltage value (Vt) less than 0 V, and the memory cells in write mode take a Vt value of 0 V or more.

Accordingly, since in read mode, applying 0 V to a memory gate (Mg) and 1.5 V to a selected switch MONOS control gate (Cg) turns on the switch MOS, whether the data bit is "1" or "0" has been judged by, in the erase mode of the associated memory cell, detecting that a current flows from a bit line (precharged to about 1 V) through that memory cell into a source line and the potential of the bit line decreases. Also, in the write mode of the memory cell, the above judgment has been conducted by detecting that the potential of the bit line precharged to about 1 V is retained. In this case, H-Z shown in FIG. 1 denotes high impedance.

Such a Dickson-type charge pump circuit as introduced and analyzed in the article of T. Tanzawa and T. Tanaka, "A dynamic analysis of the Dickson charge pump circuit," IEEE J. Solid-State Circuits, vol. 32, no. 8, pp. 1231–1240, August 1997, is generally known as an example of a charge pump circuit for generating the high voltage required for erase and/or write operations. The Dickson charge pump circuit is commonly used because of its simple circuit composition.

Although EEPROMs have long been frequently used in data update applications, further extension of EEPROMs in capacity is being desired in recent years in order to respond to the diversity of application software and the growing tendency for multiple application programs to be designed so that they operate in one LSI or one system.

Japanese Patent Nos. 1876108 and 1950956 propose MONOS memories without an enhanced N-type switch MOS (i.e., single-MONOS memories), partly because such extension of capacity is obstructed by the fact that the memory size per bit is too large.

The biases in the operation modes of one such single-MONOS memory are shown in FIG. 2. As can be seen from FIG. 2, the operating biases in erase and write modes are almost the same as for the conventional MONOS memory shown in FIG. 1, whereas, in read mode, a negative voltage of erase Vt or less needs to be applied to the memory Well and non-selected Mg.

Additionally, although all voltages to be applied to the memory may be set to 0 V in standby mode, startup from standby mode requires a time from several microseconds to tens of microseconds in order to obtain a stepped-up negative voltage that allows reading. Also a negative voltage is therefore to be applied in standby mode to increase the startup speed. In this case, symbol H-Z shown in FIG. 2 denotes high impedance.

When the size of a module type of such single-MONOS memory, including the size of a peripheral circuit, is considered, the memory itself can be downsized by deleting the switch MOS. However, a stepped-up negative voltage must also be applied in read mode and thus a charge pump circuit for reading is required. In addition, this charge pump circuit for reading needs to be increased in current supply capability so as to be capable of withstanding high-speed reading at about tens of megahertz.

In that case, in addition to the charge pump circuit for erase and write modes, a read-only charge pump circuit high in current supply capability is required, whereby it is likely to increase the total charge pump circuit size.

Additionally, since standby mode, as with read mode, makes it necessary to apply a stepped-up negative voltage, there is also a need to operate the associated charge pump circuit in standby mode, and for this reason, current consumption could increase in standby mode.

SUMMARY OF THE INVENTION

Accordingly, an object of the present invention is to provide a technique that allows area reduction and current-consumption reduction of a charge pump circuit for generating a plurality of stepped-up voltages different from each other in current supply capability.

The foregoing and other objects and novel features of the present invention will become apparent from the description given in this Specification, and from the accompanying drawings.

The following briefly describes the gist of the typical one of the present inventions disclosed in this application.

The present invention provides a semiconductor integrated circuit device which, in one charge pump circuit with an N number of basic pump cell stages connected to step up voltages in the erase and write modes of a non-volatile memory, generates stepped-up voltages lower than in the erase and write modes and different from one another in output current supply capability, by using series- or parallel-connected pump cells not in excess of the N number of pump cell stages mentioned above, and changes a voltage step-up clock to a stepped-up voltage detection signal.

Accordingly, stepped-up voltages each different in output current supply capability and lower than in erase and write modes can be generated with a single charge pump circuit without causing an increase in charge pump circuit area, and a charge pump clock circuit can be deactivated. A charge pump circuit with reduced current consumption can therefore be composed.

The following briefly describes the gist of the typical advantageous effects of the present invention disclosed in this application:

(1) It is possible to construct power supplies different in stepped-up voltage and in output current, and thus to reduce a chip area.

(2) A charge pump circuit very low in current consumption can be composed by using a step-up detection signal as a charge pump clock.

BRIEF DESCRIPTION OF THE DRAWINGS

FIG. 2 is a diagram showing the operating biases in each mode of a conventional single MONOS-type EEPROM;

DESCRIPTION OF THE PREFERRED EMBODIMENTS

Preferred embodiments of the present invention will be described in detail below with reference to the accompanying drawings. In all figures explaining the embodiments, the same symbol is assigned to the same member and repeated description thereof is omitted.

(First Embodiment)

Figure 1:
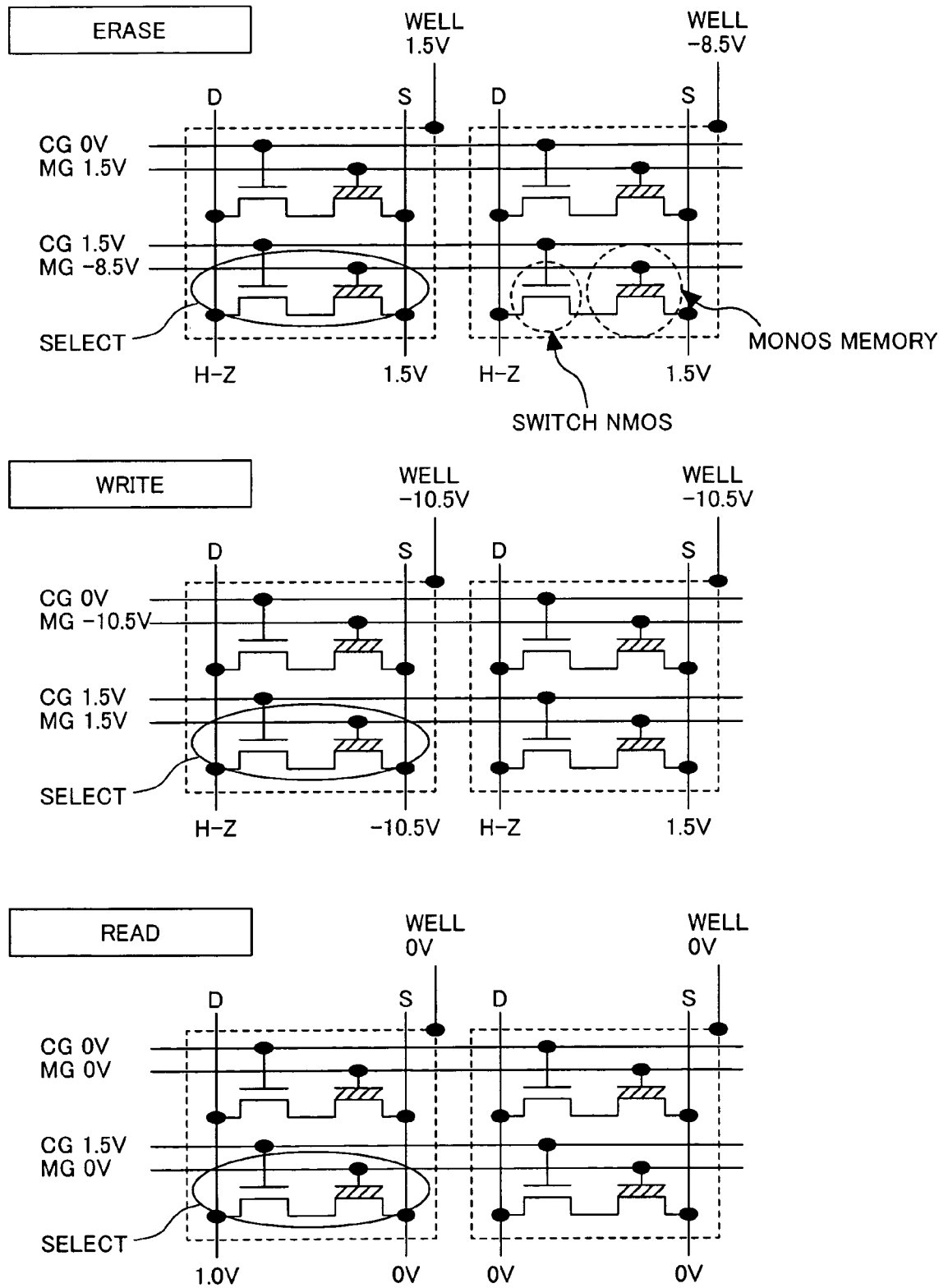
FIG. 1 is a diagram showing the operating biases in each mode of a conventional MONOS-type EEPROM.
Figure 3:
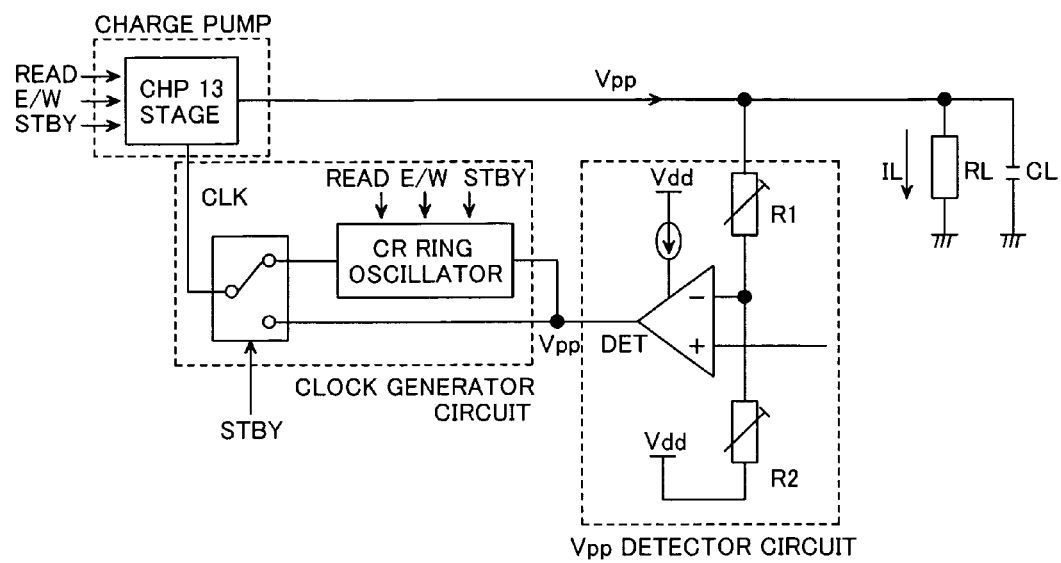
FIG. 3 is a diagram showing the composition of a charge pump circuit according to the present invention.

FIG. 3 shows a configuration example of a charge pump circuit which applies a stepped-up bias to a memory cell.

The charge pump circuit of the present invention includes a charge pump, a clock generator circuit, and a stepped-up voltage (Vpp) detector circuit for detecting Vpp.

The clock generator circuit, although composed using a general ring oscillator, is not limited by this configuration and may have any other function that allows a clock to be supplied to the charge pump. The charge pump is to generate a stepped-up voltage in synchronization with the clock.

After the charge pump has received the clock and started operating, a stepped-up voltage is generated, and when this voltage reaches a defined voltage value, the Vpp detector circuit detects the voltage value and generates Vpp DET as a Vpp detection signal.

The Vpp detector circuit includes a comparator, a reference voltage, and resistors, and generates Vpp DET by comparing the reference voltage and Vpp which has been voltage-divided by the resistors. The generation of Vpp DET here means changing a comparator output, for example, from 0 V to Vpp.

After receiving Vpp DET, the clock generator circuit deactivates the clock. The deactivation of the clock stops a voltage stepping-up operation of the charge pump.

When the voltage stepping-up operation is stopped, the stepped-up voltage is reduced below the defined voltage value and the generation of Vpp DET is stopped.

The stop of Vpp DET generation activates the clock generator circuit once again, supplies the clock to the charge pump, and operates the charge pump to step up the voltage.

This sequence is repeated to keep the defined voltage step-up value.

Figure 4:
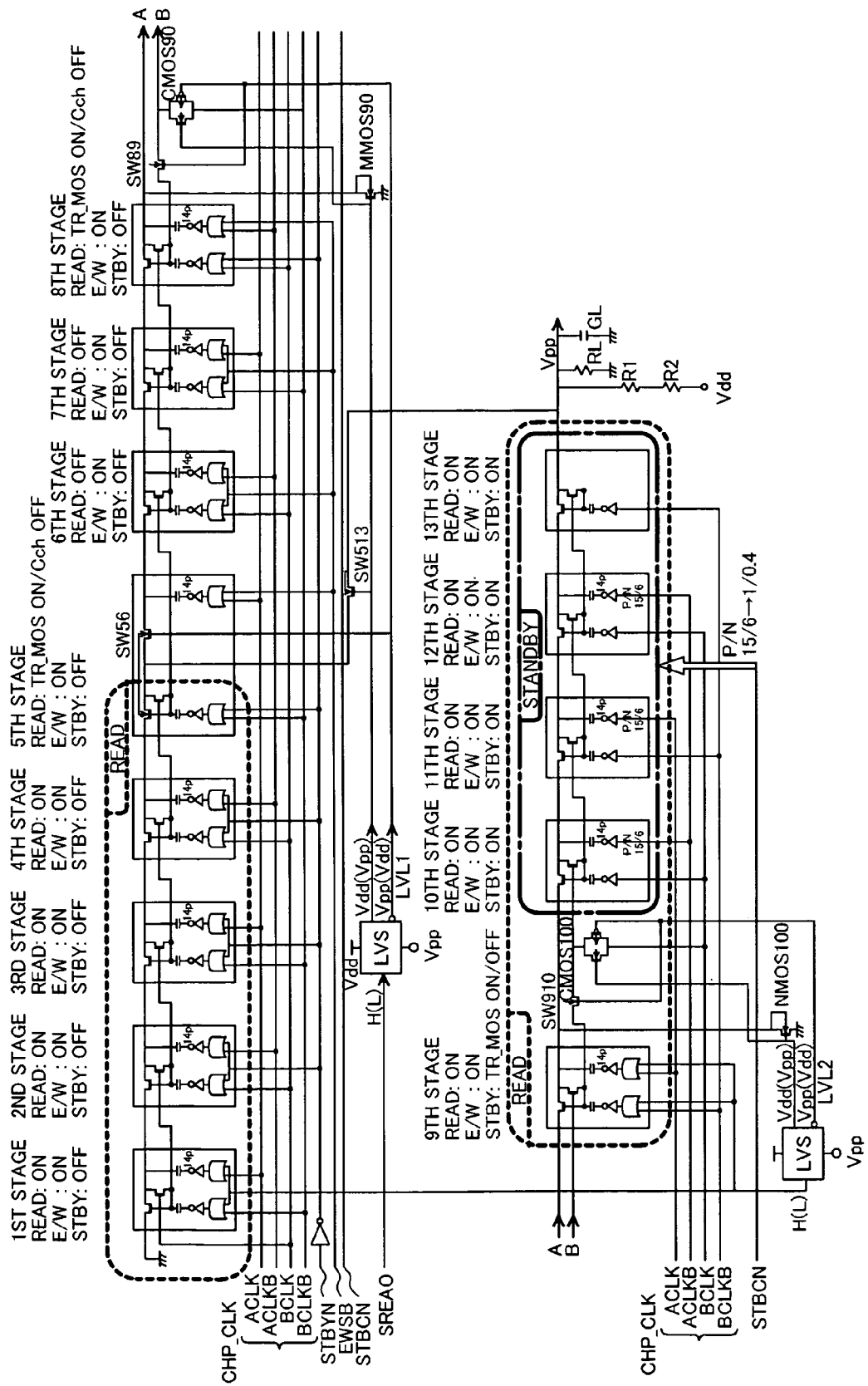
FIG. 4 is a diagram showing the circuit composition of charge pump cells in the charge pump circuit of the present invention.

FIG. 4 is a charge pump configuration diagram showing a Dickson-type charge pump circuit in which 13 pump cell stages are connected in series using a charge capacitance of 14 pF to make the circuit free from substrate effects.

A brief, operational description of the circuit shown in FIG. 4 is given below using FIG. 10. In Erase and Write modes, all switches are connected to an upper ("a") position and an N number of stages are connected in series.

Figure 10:
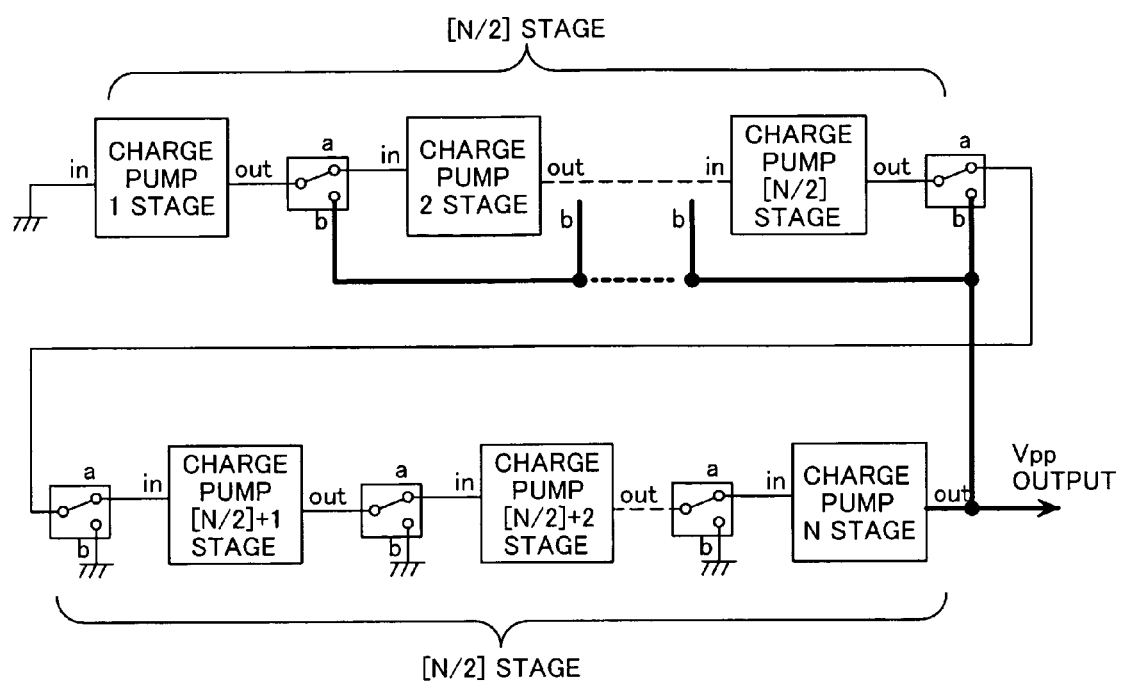
FIG. 10 is a circuit configuration diagram of the charge pumps in the charge pump circuit of the present invention.

The brackets "[ ]" in [N/2] shown in FIG. 10 mean a Gauss' notation, in which, when N is odd-numbered, this indicates (N−1)/2 and when N is even-numbered, this indicates N/2.

In Read mode, for example, if five charge pump stages operate in parallel, output switches of the five charge pump stages are each connected to a "b" position and input switches of (N−4) stages are each connected to the "b" position. All other switches are connected to the "a" position. In standby mode, for example, only three stages operate, in which case, input switches of (N−2) stages are each connected to the "b" position and all other switches are connected to the "a" position.

Figures 5, 6:
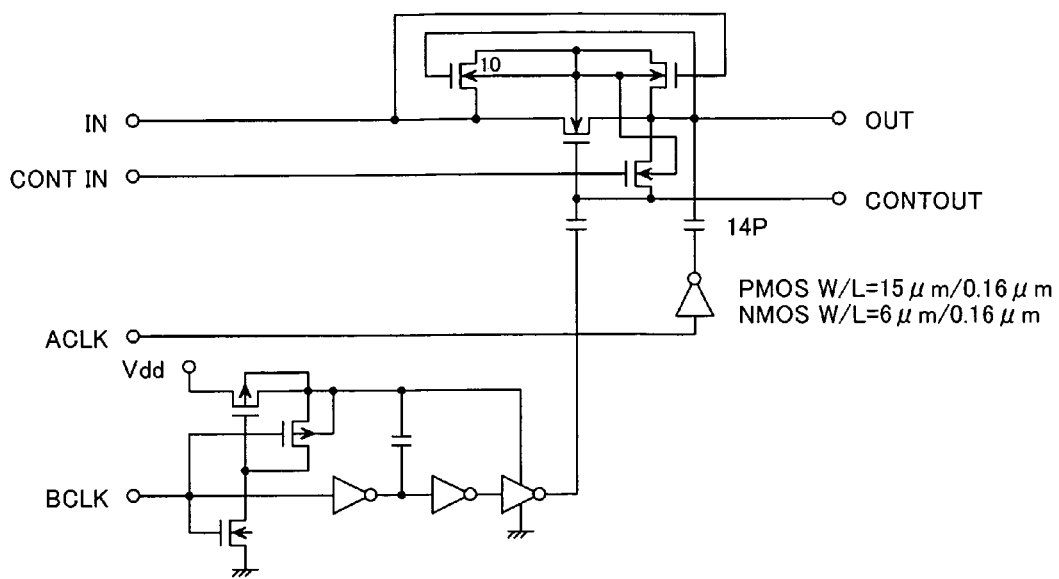
FIG. 5 is a diagram showing the charge pump circuit composition per pump cell stage according to the present invention.
FIG. 6 is a diagram that shows specifications of a charge pump circuit having a 64-KB single MONOS-type EEPROM.

Charge pump circuit elements per stage are shown in FIG. 5.

This Dickson-type charge pump circuit free from substrate effects is a circuit shown in Japanese Patent Application No. 2002-333033.

FIG. 6 is a diagram that shows the specifications of the charge pump circuit necessary to operate a 64-KB single MONOS-type EEPROM.

Negative high voltages of −8.5 V and −10.7 V are required for erase and write operations, respectively. Since Erase and Write modes utilize a tunneling effect, magnitudes of erase and write currents are several picoamperes per bit (pA/bit). Therefore, a current supply capability not greater than 10 μA⁻ suffices for an EEPROM capacity of 64 KB.

In this case, the negative high voltages of −8.5 V and −10.7 V are generated by operating all 13 pump cell stages in series.

Figure 7:
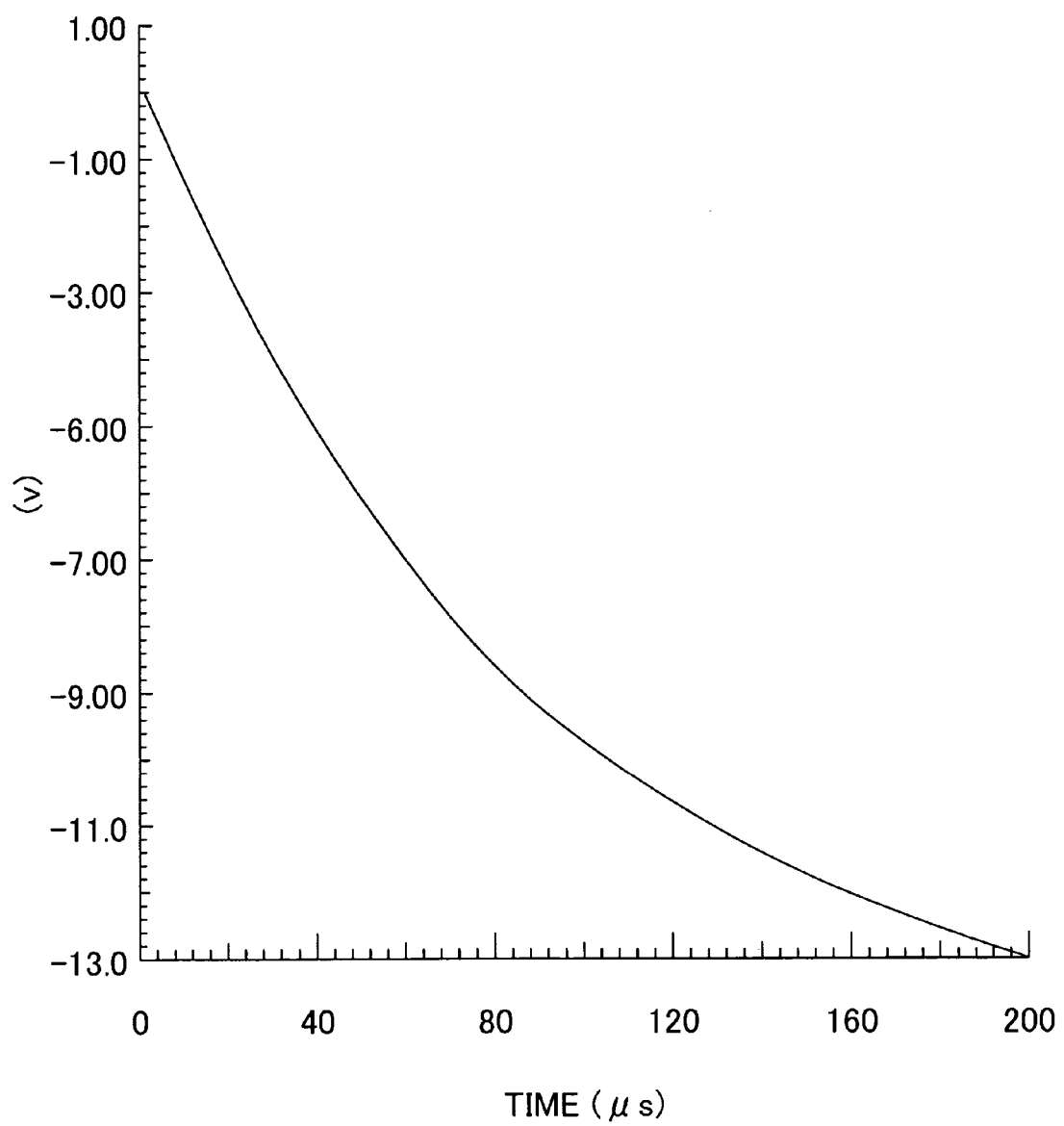
FIG. 7 is a diagram showing the Vpp simulation waveform occurring during erase/write operations in the charge pump circuit of the present invention.

A Vpp simulation waveform based on the worst conditions of Vdd=1.375 V and Ta=95° C. is shown in FIG. 7.

A clock rate of 10.8 MHz is used, and a circuit element with a 1-MΩ resistance (at a 0V-Vpp terminal connection) for obtaining an output supply current of 10 μA or more, and a circuit element with a 1000-pF capacitance equivalent to 64 KB of memory are connected as loads at a Vpp output terminal. Also, the Vpp detector circuit is turned off to confirm charge pump performance.

FIG. 7 indicates that a stepped-up voltage of at least −10.7 V can be generated at the Vpp output terminal.

Next, a voltage of −2 V that is equal to or smaller than memory information erase voltage Vt is required in Read mode. If a reading clock rate is 30 MHz and a selected memory gate (Mg) capacitance is 2 pF (equivalent to 128 bytes), the output supply current required is 120 μA, as shown in expression (1).

$$2 \times 2 \times 10^{-12} \times 30 \times 10^{6} = 120 \times 10^{-6} \quad (1)$$

Ten pump cells at charge pump front and rear stages (i.e., the 5th to 6th stages and 9th to 13th stages, respectively) are operated in parallel to compose a reading charge pump circuit for generating the voltage of −2 V at which a high supply current capability can be obtained.

A clock rate of 10.8 MHz is used, and for three pump cell stages not to be used (i.e., the 6th to 8th stages), a logic circuit is composed so as not to supply a clock.

In addition, an NMOS switch (SW56) for disconnecting the pump cells of the 5th and 6th stages, and an NMOS switch (SW513) for connecting the pump cells of the 6th and final 13th stages at respective outputs are provided and the outputs of the pump cells of the 6th and 13th stages are connected by turning SW56 off and SW513 on, respectively, by use of a level shifter LVL1 that generates a Vdd-Vpp output.

Furthermore, NMOS 90 for setting 0 V as an input of the pump cell of the 9th stage, an MNOS switch (SW89) for turning off the control signal supplied from the pump cell of the 8th stage to the pump cell of the 9th stage, and a switch CMOS 90 for connecting the control signal to the clock are controlled via LVL1 so that −2 V is also output from the final 13th stage.

Figure 8:
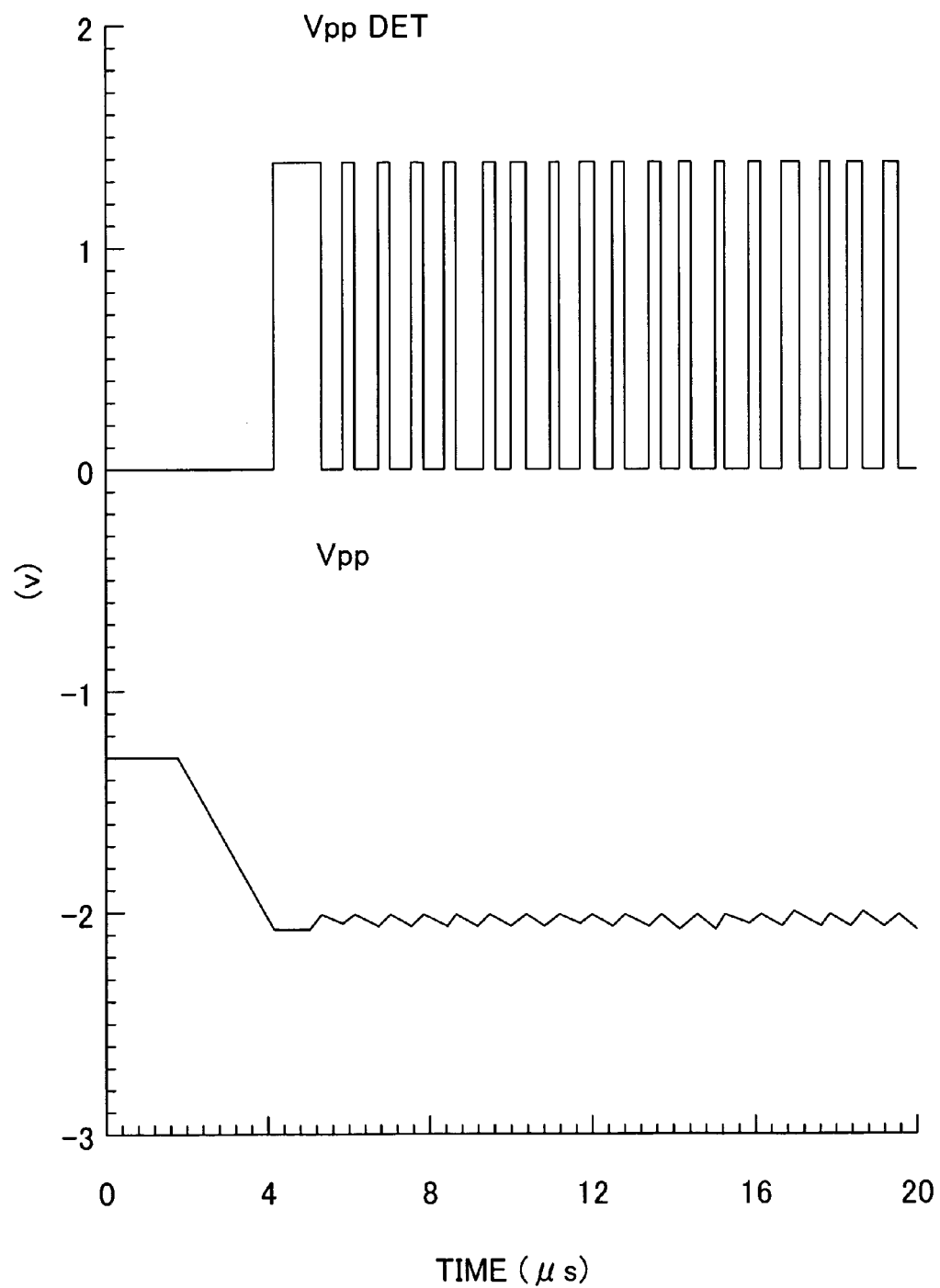
FIG. 8 is a diagram showing the simulation waveform occurring during read operations in the charge pump circuit of the present invention.

Another Vpp simulation waveform based on the worst conditions of Vdd=1.375 V and Ta=95° C. is shown in FIG. 8. An Mg driver for turning on and off the 2-pF capacitance at 35 MHz at the 0V-Vpp terminal connection is operated as a load of Vpp. Also, the Vpp detector circuit is operated to detect a voltage of −2V typ. (typical).

It can be seen from FIG. 8 that −2.00±0.15 V can be continuously output during the 35-MHz read operation with an output supply current of Iout=163.6 μA avr. (average: measured simulation value).

Next, operation in standby mode is described. As mentioned above, in standby mode, Vpp also needs to be −1.5 V typ. and a maximum of 1 μA is set as a Vpp supply current with a leakage current taken into consideration.

Additionally, since current consumption in the entire charge pump circuit needs to be reduced in standby mode, charge pump circuit current consumption needs to be controlled below 10 μA.

The last four pump cell stages (i.e., the pump cells of the 10th to 13th stages) are operated as the charge pump circuit in standby mode, and for the other nine stages (the 1st to 9th stages), a logic circuit is composed so as not to supply a clock.

In addition, NMOS 100 for setting 0 V as an input of the pump cell of the 10th stage, an MNOS switch (SW910) for turning off the control signal supplied from the pump cell of the 9th stage to the pump cell of the 10th stage, and a switch CMOS 100 for connecting the control signal to the clock are controlled via LVL2.

Furthermore, clock driver capabilities of the four pump cell stages to be operated are switched and thus the through-current generated during charge capacitance driving is suppressed to reduce circuit current consumption.

Also, the clock generator circuit is deactivated and a Vpp detection signal is input as the clock supplied to the charge pump. The Vpp detection signal, as mentioned above, changes from 0 V to Vdd at a specified voltage or less, and changes from Vdd to 0 V at the specified voltage or more, whereby the signal can be used as the clock.

Thus, the current consumed in the clock generator circuit can be suppressed to almost zero, and this means that the total current consumption in the charge pump circuit can be reduced.

Figure 9:
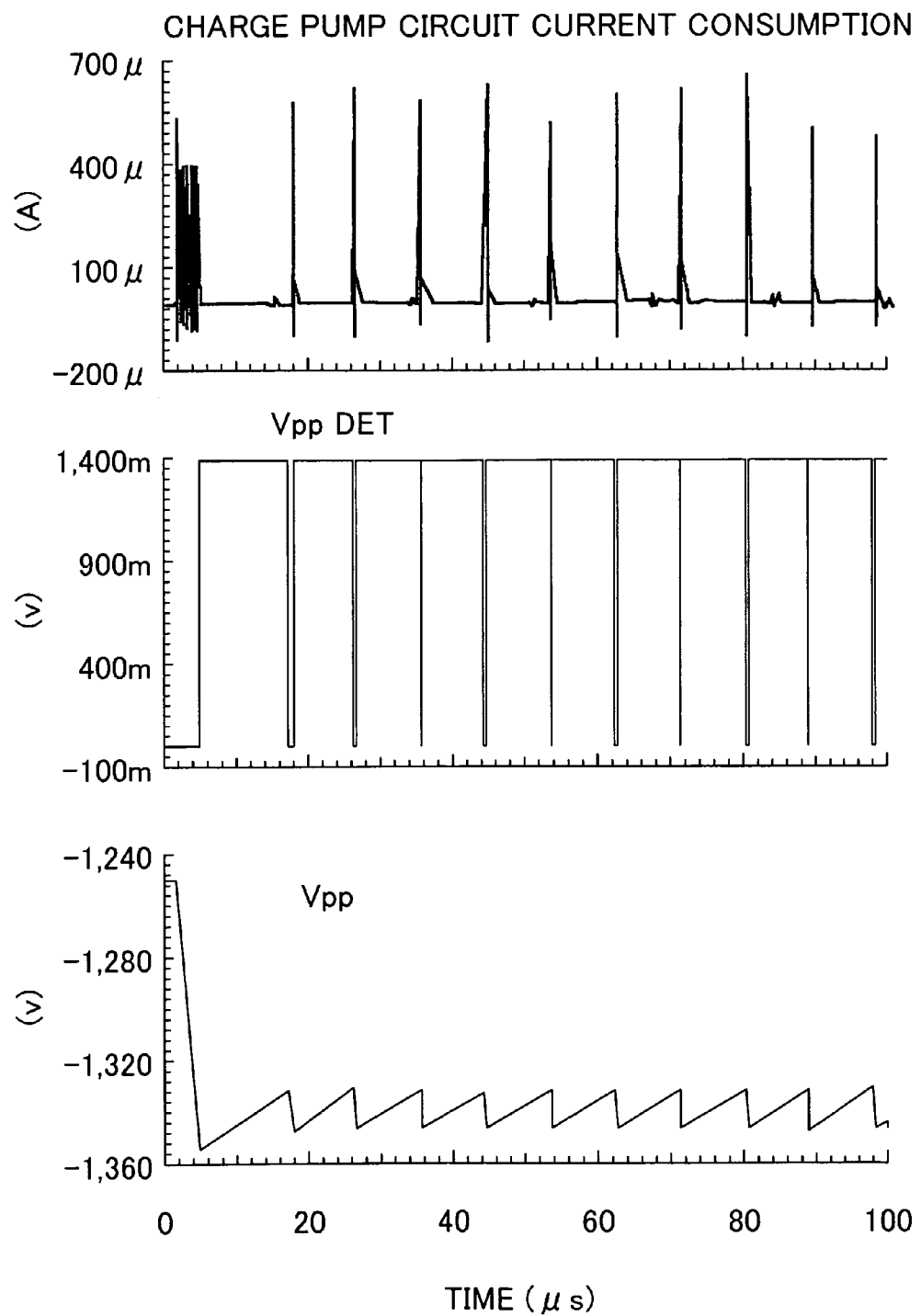
FIG. 9 is a diagram showing the simulation waveform occurring during standby (Stby) operations in the charge pump circuit of the present invention.

Yet another Vpp simulation waveform based on conditions (Vdd=1.375 V, Ta=95° C.) under which Vpp output capabilities decrease to the lowest level is shown in FIG. 9.

Since Vpp DET indicates that Vpp fluctuates from −1.33 V to −1.346 V, it can be seen that Vpp DET is functioning as the charge pump clock.

Current consumption in the entire charge pump circuit totals 7 μA (4 μA in the charge pump, and 3 μA in the Vpp detector circuit). This indicates that reduction in current consumption has been achieved.

The legend used in the drawings accompanying this application is shown below.

CG . . . Control gate, MG . . . Memory gate, Select . . . Selected region, H-Z . . . High impedance, E/W . . . Erase/Write, Read . . . Readout, Write . . . Writing, Stby . . . Standby, IL . . . Leakage current.

What is claimed is:

1. A charge pump circuit comprising:
    a non-volatile memory having an M, with M>2, number of stages of basic pump cells;
    wherein the M number of stages of basic pump cells are connected in series to supply a control voltage for data writing or erasure; and
    wherein N basic pump cells, with M>N, selected from the M number of stages of basic pump cells are connected in parallel to supply a control voltage for data readout, and
    wherein a number of the basic pump cells less than the M number of stages operate when the non-volatile memory is in a standby mode.

2. The charge pump circuit according to claim 1:
    wherein the N basic pump cells, with M>N, connected in parallel comprise one pair of basic pump cells comprised of stages not exceeding N/2 stages, wherein the one pair of basic pump cells operate in parallel.

3. The charge pump circuit according to claim 1, wherein:
    the N basic pump cells, with M>N, connected in parallel comprises a first set of basic pump cells including a first stage of the basic pump cells and a second set of basic pump cells including a last stage of the basic pump cells,
    and outputs of the first and second sets of basic pump cells are combined.

4. The charge pump circuit according to claim 1,
    wherein the charge pumps operated in the standby mode are last stages of the N number of stages of basic pump cells including the last stage of the basic pump cell.

5. The charge pump circuit according to claim 1, comprising:
    a detector circuit adapted to judge whether or not an output voltage of said basic pump cells is in excess of a desired threshold value, and to generate two kinds of different voltages according to the judgment;
    wherein said basic pump cells are controlled by the two kinds of different voltages that said detector circuit generates.

6. The charge pump circuit according to claim 2, comprising:
    a detector circuit adapted to judge whether or not an output voltage of said basic pump cells is in excess of a desired threshold value, and to generate two kinds of different voltages according to the judgment;

wherein said basic pump cells are controlled by the two kinds of different voltages that said detector circuit generates.

7. The charge pump circuit according to claim 3, comprising:
a detector circuit adapted to judge whether or not an output voltage of said basic pump cells is in excess of a desired threshold value, and to generate two kinds of different voltages according to the judgment;
wherein said basic pump cells are controlled by the two kinds of different voltages that said detector circuit generates.

8. The charge pump circuit according to claim 1, comprising:
a clock generator circuit adapted to generate two kinds of different voltages at a fixed period and to control said basic pump cells,
wherein said clock generator circuit is adapted not to supply the two kinds of different voltages to basic pump cells which are not to be operated.

9. The charge pump circuit according to claim 2, comprising:
a clock generator circuit adapted to generate two kinds of different voltages at a fixed period and to control said basic pump cells;
wherein said clock generator circuit is adapted not to supply the two kinds of different voltages to basic pump cells which are not to be operated.

10. The charge pump circuit according to claim 3, comprising:
a clock generator circuit adapted to generate two kinds of different voltages at a fixed period and to control said basic pump cells;
wherein said clock generator circuit is adapted not to supply the two kinds of different voltages to basic pump cells which are not to be operated.

11. The charge pump circuit according to claim 8,
wherein, when one of said basic pump cells generates a voltage that controls data erasure, writing, and readout of the non-volatile memory, said clock generator circuit is adapted to change the voltage-generating period, and
when said one of said basic pump cells generates a voltage that controls standby of the non-volatile memory, said clock generator circuit is adapted to change driving capability.

12. The charge pump circuit according to the claim 1, wherein the non-volatile memory is comprised of semiconductor storage elements arrayed in a matrix form.

13. The charge pump circuit according to claim 12, wherein an MONOS-structured memory cell is used in each of the semiconductor storage elements.

* * * * *